(12) United States Patent
Azadet et al.

(10) Patent No.: US 8,633,842 B2
(45) Date of Patent: Jan. 21, 2014

(54) METHODS AND APPARATUS FOR DIRECT SYNTHESIS OF RF SIGNALS USING DELTA-SIGMA MODULATOR

(75) Inventors: Kameran Azadet, Morganville, NJ (US); Samer Hijazi, Bethlehem, PA (US); Joseph H. Othmer, Ocean, NJ (US)

(73) Assignee: Agere Systems LLC, Allentown, PA (US)

( * ) Notice: Subject to any disclaimer, the term of this patent is extended or adjusted under 35 U.S.C. 154(b) by 0 days.

(21) Appl. No.: 13/254,397

(22) PCT Filed: Mar. 31, 2009

(86) PCT No.: PCT/US2009/038929
§ 371 (c)(1),
(2), (4) Date: Sep. 1, 2011

(87) PCT Pub. No.: WO2010/114521
PCT Pub. Date: Oct. 7, 2010

(65) Prior Publication Data
US 2012/0014426 A1 Jan. 19, 2012

(51) Int. Cl.
*H03M 3/00* (2006.01)
(52) U.S. Cl.
USPC ............ 341/143; 341/118; 341/120; 341/155
(58) Field of Classification Search
USPC .................. 341/143, 118, 120, 155
See application file for complete search history.

(56) References Cited

U.S. PATENT DOCUMENTS

| | | | | |
|---|---|---|---|---|
| 4,107,669 A | * | 8/1978 | Tewksbury | 341/143 |
| 4,622,537 A | * | 11/1986 | Aiko | 341/51 |
| 5,041,830 A | * | 8/1991 | Abe | 341/77 |
| 5,424,739 A | * | 6/1995 | Norsworthy et al. | 341/143 |
| 6,002,352 A | * | 12/1999 | El-Ghoroury et al. | 341/139 |
| 6,657,566 B1 | * | 12/2003 | Risbo et al. | 341/53 |
| 6,738,003 B2 | * | 5/2004 | Melanson | 341/143 |
| 6,864,818 B1 | * | 3/2005 | Hezar | 341/143 |
| 7,194,036 B1 | * | 3/2007 | Melanson | 375/247 |
| 7,298,305 B2 | * | 11/2007 | Melanson | 341/143 |
| 7,307,565 B1 | * | 12/2007 | Melanson | 341/143 |
| 7,868,798 B2 | * | 1/2011 | Azadet et al. | 341/131 |

FOREIGN PATENT DOCUMENTS

| | | |
|---|---|---|
| GB | 2 438 657 A | 12/2007 |
| WO | WO 96/31943 | 10/1996 |

OTHER PUBLICATIONS

Makoto et al., "SigmaDelta Type Noise Shaper," Japanese Abstract No. JP2007006317(A) (Jan. 11, 2007).

* cited by examiner

*Primary Examiner* — Linh Nguyen
(74) *Attorney, Agent, or Firm* — Ryan, Mason & Lewis, LLP

(57) ABSTRACT

Methods and apparatus are provided for direct synthesis of RF signals using a delta-sigma modulator. An RF signal is synthesized from an input signal by quantizing the input signal using a quantizer, such as a one bit quantizer; determining a quantization error associated with the quantizer; generating an error prediction value using an error predictive filter, wherein the error predictive filter comprises one or more filter zeroes on a unit circle for one or more desired frequencies of $f_1, f_2, \ldots f_n$ and one or more filter poles having a magnitude inside the unit circle and a frequency substantially equal to the one or more desired frequencies of $f_1, f_2, \ldots f_n$; and subtracting the error prediction value from the input signal. The filter poles have a magnitude that reduces a boost provided out-of-band.

18 Claims, 2 Drawing Sheets

US 8,633,842 B2

METHODS AND APPARATUS FOR DIRECT SYNTHESIS OF RF SIGNALS USING DELTA-SIGMA MODULATOR

FIELD OF THE INVENTION

The present invention is related to delta-sigma modulators and, more particularly, to techniques for direct synthesis of RF signals using a delta-sigma modulator.

BACKGROUND OF THE INVENTION

Generally, communication signals are transmitted at a desired frequency that is obtained by multiplying the original information carrying base band signal by a carrier frequency. In a Radio Frequency (RF) transmitter, for example, the desired RF frequency is typically obtained from the information carrying digital base band signal by converting the digital signal to an analog signal, and then mixing the analog signal with an RF carrier frequency signal using one or more mixers.

A number of direct synthesis techniques have been proposed or suggested for directly synthesizing RF signals from the information carrying digital base band signal. Among other benefits, direct synthesis techniques exhibit reduced footprint and power consumption characteristics. For example, high speed digital-to-analog converters (DACs) and delta-sigma converters have been proposed for this task. Direct synthesis techniques that employ high speed DACs typically exhibit a signal-to-noise ratio that is limited by the precision of the high speed DACs, such as high resolution and high speed current steering DACs. For example, existing high speed DACs typically have a precision of less than 8 bits when operating at the required multi Giga-sample per second rates.

Likewise, direct synthesis techniques that employ delta-sigma converters exhibit narrow signal bandwidths relative to the desired RF frequency. Typically, existing techniques employ delta-sigma converters having a relatively low order (e.g., up to an order of four) and require high over-sampling ratios (e.g., an over-sampling ratio of 64 or more). To alleviate this problem, multi-bit delta-sigma quantizers have been proposed. While this improvement may reduce the requirement in terms of over-sampling ratio and noise shaping, multi-bit DACs with high accuracy are required after the quantizer and the multi-bit delta-sigma quantizers have difficulty achieving the desired Spurious Free Dynamic Ranges (SFDRs) of 90 dB or more A need therefore exists for improved methods and apparatus for direct synthesis of RF signals using a delta-sigma modulator. A further need exists for direct synthesis techniques that exhibit improved signal bandwidth, signal-to-noise ratios and filtering requirements for out-of-band noise.

SUMMARY OF THE INVENTION

Generally, methods and apparatus are provided for direct synthesis of RF signals using a delta-sigma modulator. According to one aspect of the invention, an RF signal is synthesized from an input signal by quantizing the input signal using a quantizer, such as a one bit quantizer; determining a quantization error associated with the quantizer; generating an error prediction value using an error predictive filter, wherein the error predictive filter comprises one or more filter zeroes on a unit circle for one or more desired frequencies of $f_1, f_2, \ldots f_N$ and one or more filter poles having a magnitude inside the unit circle and a frequency substantially equal to the one or more desired frequencies of $f_1, f_2, \ldots f_N$; and subtracting the error prediction value from the input signal.

Generally, the filter poles have a magnitude that reduces a boost provided out-of-band. The filter zeroes can be fixed for the one or more desired frequencies of $f_1, f_2, \ldots f_N$, or be variable and programmatically established. The quantization error can be obtained by comparing an input to the one bit quantizer to an output of the one bit quantizer.

A more complete understanding of the present invention, as well as further features and advantages of the present invention, will be obtained by reference to the following detailed description and drawings.

DETAILED DESCRIPTION

The present invention directly synthesizes an RF signal in the digital domain and converts the digital RF signal to an analog signal using a delta-sigma modulator having a one bit output. In one exemplary implementation discussed herein, the delta-sigma converter has an order of at least 18 with a relatively wide signal bandwidth, in order to ease the filtering of out-of-band quantization noise.

A high order delta-sigma modulator allows the ratio of the RF frequency to the signal bandwidth to be minimized, for example, to a factor of 10. In this manner, the RF filtering requirement is reduced to a quality factor, Q, less than 10, making RF filtering of the noise-shaped output more practical. In one exemplary implementation discussed herein, the RF signal bandwidth of the delta-sigma modulator is significantly larger than the bandwidth of the information carrying base band signal. Noise shaping techniques are employed to ensure that the quantization noise is out-of-band relative to the RF signal.

The present invention recognizes that the one bit output is inherently linear and alleviates non-linearity issues associated with the output of the DAC. In one exemplary implementation, a delta-sigma modulator in accordance with the present invention has an RF center frequency of 2 GHz and demonstrates a signal-to-noise ratio in excess of 110 dB with a signal bandwidth of 150 MHz.

Figure 1:
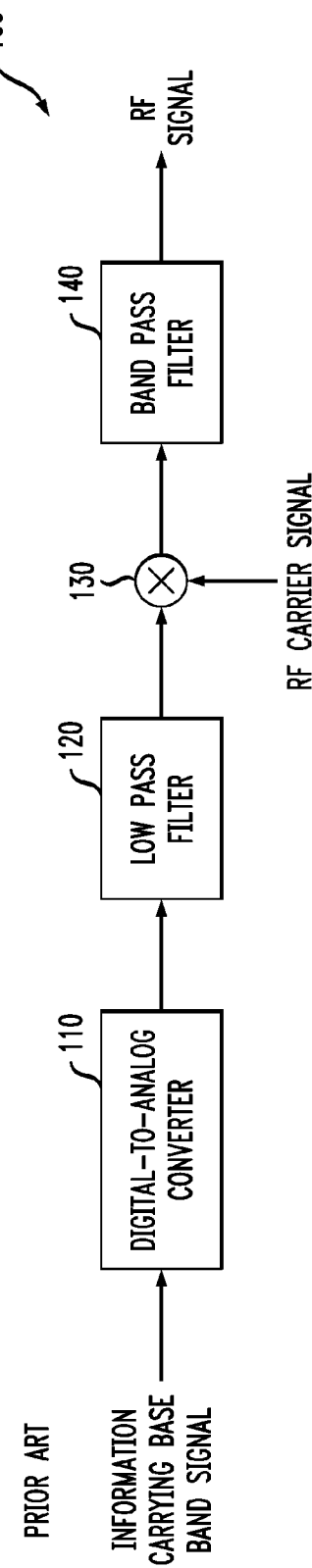
FIG. 1 illustrates a conventional RF transmitter.

FIG. 1 illustrates a conventional RF transmitter 100. As shown in FIG. 1, the conventional RF transmitter 100 initially converts the information carrying base band signal to a digital signal using a digital-to-analog converter 110. The digital signal is then filtered by a low pass filter 120 and mixed with an RF carrier frequency signal using a mixer 130. The output of the mixer 130 is then filtered by a band pass filter 140 to reduce the out-of-band noise, in a known manner.

Figure 2:
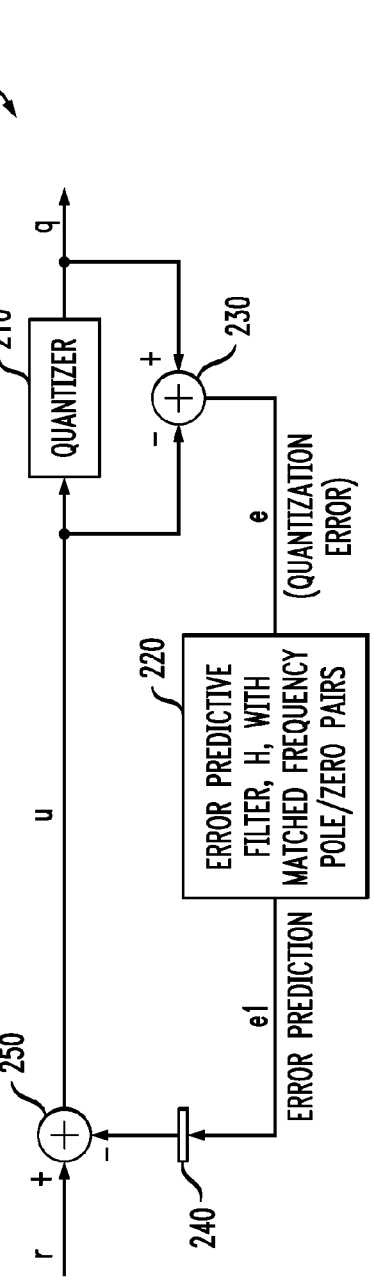
FIG. 2 illustrates an exemplary delta-sigma modulator in accordance with the present invention.

FIG. 2 illustrates an exemplary delta-sigma modulator 200 in accordance with the present invention. As shown in FIG. 2, the exemplary delta-sigma modulator 200 employs a one bit quantizer 210 and an error predictive filter 220 with matched frequency pole/zero pairs in accordance with the present invention. The matched frequency pole/zero pairs are discussed further below in conjunction with Equation (2). The exemplary error predictive filter 220 has an order of 18.

The input value, u, to the one bit quantizer 210 is compared to the quantized output value, q, by an adder 230 that generates a quantization error, e. The quantization error, e, is processed by the error predictive filter 220 to generate an error prediction value. e1, that is stored in a register 240 for one clock cycle and then subtracted from the input signal, r, by an adder 250 that generates the error-compensated input value, u. Generally, error predictive filters 220 employ some knowledge of the input signal to filter the signal, in a known manner. For example, if the error is known to be slowly varying, the error predictive filter 220 can use the same value for subsequent samples.

Generally, the output of the one bit quantizer 210 provides a coarse approximation of the input signal. The input signal, r, may be, for example, a 16 bit digital value, and the one bit quantization performed by the quantizer 210 (e.g., the quantization can be based on the polarity of the input signal) in accordance with the present invention provides a coarse analog conversion. The quantization noise, e, associated with the one bit quantizer 210 is primarily out-of-band. As previously indicated, the present invention recognizes that the one bit quantization performed by the quantizer 210 is inherently linear.

In the exemplary embodiment described herein, the quantization error, e(n), is assumed to be uncorrelated to the input, r(n). Thus, the power spectral density, $S_{q,q}$, of the quantizer output, q(t), can be expressed a function of the frequency, f, as follows:

$$S_{q,q}(f) = S_{r,r}(f) + (1-H(z))^2 S_{e,e}(f) \quad (1)$$

where r is the input signal and $$z = e^{2j\pi \frac{f}{F_s}}.$$

Controlled Zero Placement

The present invention recognizes that the contribution of the power spectral density, $S_{e,e}$, of the quantization error, e, to the overall power spectral density, $S_{q,q}$, will be approximately zero in the band-of-interest when the error predictive filter 220 has zeroes at certain frequencies. In particular, the second term in equation (1) is a function of frequency and can be set to a value of approximately zero in the band-of-interest. As previously indicated, non-zero values in an out-of-band range can be filtered, in a known manner.

Thus, to minimize the quantization noise, the error predictive filter 220. H(z), is designed such that the absolute value of (1–H(z)) is less than a predefined value (ideally zero). In one implementation, the predefined value is chosen based on a stability criterion, discussed below.

$$1 - H(z) = \frac{\left(1 - e^{j\frac{f_1}{F_s}} z^{-1}\right)\left(1 - e^{j\frac{f_2}{F_s}} z^{-1}\right) \ldots \left(1 - e^{j\frac{f_N}{F_s}} z^{-1}\right)}{\left(1 - \alpha_1 e^{j\frac{f_1}{F_s}} z^{-1}\right)\left(1 - \alpha_2 e^{j\frac{f_2}{F_s}} z^{-1}\right) \ldots \left(1 - \alpha_N e^{j\frac{f_N}{F_s}} z^{-1}\right)} \quad (2)$$

where $z^{-1}$ is a delay term corresponding to the delay element 240 (recognizing that prior sample values can predict current sample values). As shown by equation (2), the value of (1–H (z)) goes to zero when any of the terms in the numerator of equation (2) go to zero. In particular, the quantization noise goes to zero at frequencies of $f_1, f_2, \ldots f_N$. In this manner, the error predictive filter 220 can be configured such that the quantization noise is small in the band-of-interest.

According to one aspect of the invention, the error predictive filter 220 is designed such that the value of (1–H(z)) provides the filter zeroes on the unit circle for desired frequencies of $f_1, f_2, \ldots f_N$. In addition, the error predictive filter 220 is designed such that the filter poles have magnitudes strictly inside the unit circle, and have frequencies substantially equal to $f_1, f_2, \ldots f_N$. The actual magnitude values, $\alpha_i$, of the poles are established to insure stability by limiting excessive out-of-band boosting of noise.

Figure 3:
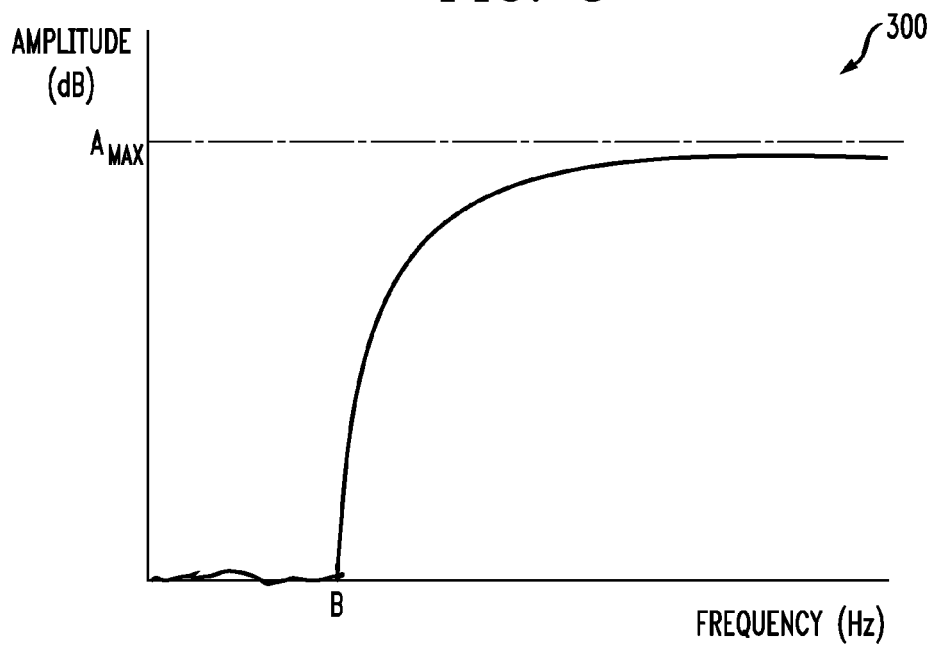
FIG. 3 illustrates a frequency response for an exemplary error predictive filter of FIG. 2.

FIG. 3 illustrates a frequency response 300 for an exemplary error predictive filter 220. As shown in FIG. 3, the frequency response is substantially zero within the band-of-interest, B, and the pole is below one outside the band-of-interest (identified by a frequency, B). The frequency response approaches an amplitude of $A_{max}$ outside the band-of-interest. It is noted that the band-of-interest need not be the exemplary base band scenario shown in FIG. 3, as would be apparent to a person of ordinary skill in the art. It is further noted that if the magnitude, $\alpha_i$, of the pole was equal to one, the numerator and denominator in equation (2) would cancel each other out and the error predictive filter 220 would not provide any filtering.

In this manner, an error predictive filter 220 in accordance with the present invention provides zeroes at desired frequencies of $f_1, f_2, \ldots f_N$, and provides poles at substantially the same frequencies as the zeroes, with the poles having magnitude values, $\alpha_i$, less than one. It is noted that the placement of the poles and zeros may be fixed or variable and may be optimized for a given implementation, as would be apparent to a person of ordinary skill in the art.

Figure 4:
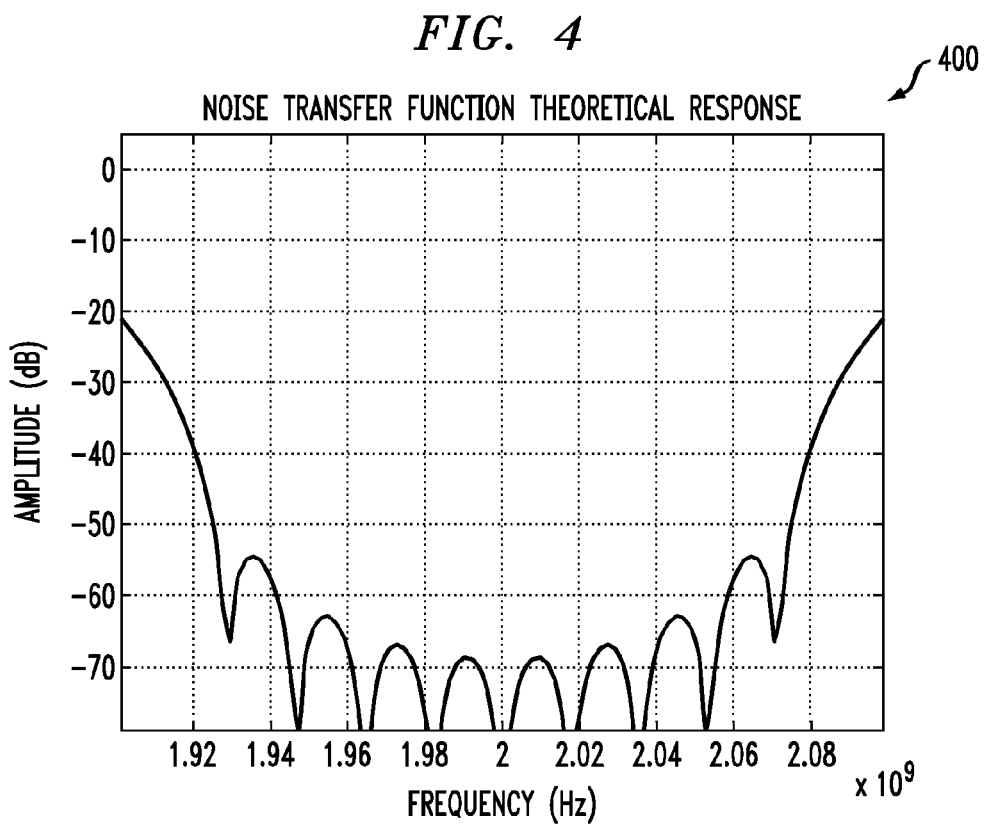
FIG. 4 illustrates a frequency response for an exemplary one bit delta-sigma modulator in accordance with the present invention.

FIG. 4 illustrates a frequency response 400 for an exemplary one bit delta-sigma modulator 200 in accordance with the present invention having an order of 18. As shown in FIG. 4, the exemplary error predictive filter 220 exhibits a passband around 2 GHz and has a bandwidth of 100 MHz. Significantly, the exemplary error predictive filter 220 demonstrates an SFDR of 110 dB.

Typically, the one bit quantization performed by the quantizer 210 would require a high oversampling ratio. For example, audio encoding techniques that employ one bit quantization of audio signals that are on the order of 100 KHz typically oversample the audio signal at a rate of 20 MHz. Such oversampling is not practical in the wireless communication context of the present invention, where the signals are typically on the order of multiple GHz. The desired low oversampling rates of the present invention, however, would typically lead to an unstable encoder. As discussed hereinafter, aspects of the present invention provide techniques for providing a stable encoder based on one bit quantization.

As previously indicated, the quantization error, e(n), is assumed to be uncorrelated to the input r(n) in one or more embodiments. More typically, however, the error signal may be correlated to the input. Thus, the delta-sigma modulator 200 may suffer from noise coloration due to the correlation of the quantization noise with the input of the quantizer 210, particularly for low resolution quantizers, such as the one bit quantizers described herein. In order to reduce the effects of the correlation between the quantization noise and the input, a dithering configuration or a decorrelating configuration (or both) can be employed to reduce the noise correlation without significantly degrading the signal to noise ratio. For a more detailed discussion of a dithering configuration or a decorrelating configuration, see United States Patent Applications entitled "Methods and Apparatus for Whitening Quantization Noise in a Delta-Sigma Modulator Using Dither Signal," and "Methods and Apparatus for Decorrelating Quantization Noise in a Delta-Sigma Modulator," each filed contemporaneously herewith and incorporated by reference herein.

When the sampling rate of a delta-sigma modulator exceeds rates of 400-800 MHz, it may become challenging to implement the delta-sigma modulator 200 using existing CMOS technology (e.g., 45 nm process). In order to permit an implementation of the delta-sigma modulator 200 at arbitrarily high sampling frequencies, potentially as high as 8 GS/s or more, look-ahead block processing can be employed. For a more detailed discussion of a look-ahead block processing configuration, see United States Patent Application, entitled "Methods and Apparatus for Look-Ahead Block Processing In Predictive Delta-Sigma Modulators," filed contemporaneously herewith and incorporated by reference herein.

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for synthesizing an RF signal from an input signal, comprising:
   quantizing said input signal using a quantizer;
   determining a quantization error associated with said quantizer;
   generating an error prediction value using an error predictive filter, wherein said error predictive filter comprises a plurality of filter zeroes on a unit circle for one or more desired frequencies of $f_1, f_2, \ldots f_N$ and a corresponding plurality of filter poles having a magnitude inside said unit circle and a frequency substantially equal to said one or more desired frequencies of $f_1, f_2, \ldots f_N$; and
   subtracting said error prediction value from said input signal.

2. The method of claim 1, wherein said filter poles have a magnitude that reduces an out-of-band boosting of noise.

3. The method of claim 1, wherein said filter zeroes are fixed for said one or more desired frequencies of $f_1, f_2, \ldots f_N$.

4. The method of claim 1, wherein said filter zeroes are variable and said one or more desired frequencies of $f_1, f_2, \ldots f_N$ are programmable values.

5. The method of claim 1, wherein said step of determining a quantization error further comprises the step of comparing an input to said one bit quantizer to an output of said one bit quantizer.

6. The method of claim 1, wherein said quantizer is a one bit quantizer.

7. A delta-sigma modulator, comprising:
   a quantizer for quantizing an input signal;
   a comparison circuit for determining a quantization error associated with said quantizer;
   an error predictive filter to generate an error prediction value, wherein said error predictive filter comprises a plurality of filter zeroes on a unit circle for one or more desired frequencies of $f_1, f_2, \ldots f_N$ and a corresponding plurality of filter poles having a magnitude inside said unit circle and a frequency substantially equal to said one or more desired frequencies of $f_1, f_2, \ldots f_N$; and
   an adder for subtracting said error prediction value from said input signal.

8. The delta-sigma modulator of claim 7, wherein said filter poles have a magnitude that reduces an out-of-band boosting of noise.

9. The delta-sigma modulator of claim 7, wherein said filter zeroes are fixed for said one or more desired frequencies of $f_1, f_2, \ldots f_N$.

10. The delta-sigma modulator of claim 7, wherein said filter zeroes are variable and said one or more desired frequencies of $f_1, f_2, \ldots f_N$ are programmable values.

11. The delta-sigma modulator of claim 7, wherein said comparison circuit obtains said quantization error by comparing an input to said one bit quantizer to an output of said one bit quantizer.

12. The delta-sigma modulator of claim 7, wherein said quantizer is a one bit quantizer.

13. An integrated circuit, comprising:
   a delta-sigma modulator, comprising:
   a quantizer for quantizing an input signal;
   a comparison circuit for determining a quantization error associated with said quantizer;
   an error predictive filter to generate an error prediction value, wherein said error predictive filter comprises a plurality of filter zeroes on a unit circle for one or more desired frequencies of $f_1, f_2, \ldots f_N$ and a corresponding plurality of filter poles having a magnitude inside said unit circle and a frequency substantially equal to said one or more desired frequencies of $f_1, f_2, \ldots f_N$; and
   an adder for subtracting said error prediction value from said input signal.

14. The integrated circuit of claim 13, wherein said filter poles have a magnitude that reduces an out-of-band boosting of noise.

15. The integrated circuit of claim 13, wherein said filter zeroes are fixed for said one or more desired frequencies of $f_1, f_2, \ldots f_N$.

16. The integrated circuit of claim 13, wherein said filter zeroes are variable and said one or more desired frequencies of $f_1, f_2, \ldots f_N$ are programmable values.

17. The integrated circuit of claim 13, wherein said comparison circuit obtains said quantization error by comparing an input to said one bit quantizer to an output of said one bit quantizer.

18. The integrated circuit of claim 13, wherein said quantizer is a one bit quantizer.

\* \* \* \* \*